United States Patent [19]

Sinha

[11] 3,923,559

[45] Dec. 2, 1975

[54] USE OF TRAPPED HYDROGEN FOR ANNEALING METAL-OXIDE-SEMICONDUCTOR DEVICES

[75] Inventor: Ashok Kumar Sinha, Murray Hill, N.J.

[73] Assignee: Bell Telephone Laboratories, Incorporated, Murray Hill, N.J.

[22] Filed: Jan. 13, 1975

[21] Appl. No.: 540,643

[52] U.S. Cl. .................... 148/1.5; 148/187; 357/23

[51] Int. Cl.[2] ........................................ H01L 21/324

[58] Field of Search ................ 148/1.5, 187; 357/23

[56] References Cited

UNITED STATES PATENTS

| | | | |
|---|---|---|---|
| 3,442,721 | 5/1969 | McCaldin et al. | 148/1.5 X |
| 3,849,204 | 11/1974 | Fowler | 148/1.5 |
| 3,852,120 | 12/1974 | Johnson et al. | 148/1.5 |

OTHER PUBLICATIONS

Swaroop, "Hydrogen Annealing Effect on Silicon–Insulator(s) Interface States," J. Phys. D: Appl. Phys., Vol. 6, 1973, pp. 1090, 1092.

*Primary Examiner*—L. Dewayne Rutledge
*Assistant Examiner*—J. M. Davis
*Attorney, Agent, or Firm*—D. I. Caplan

[57] ABSTRACT

In a metal-oxide-semiconductor field effect transistor (MOSFET) device, in which the surface of the silicon semiconductor substrate suffers damage during such steps as a sputtering type deposition of a metallic electrode layer, and in which the silicon dioxide layer of the MOSFET device is sealed by the combination of metallic electrodes and insulator layers which are impervious to hydrogen, gaseous hydrogen in introduced into the oxide layer prior to the deposition of the metallic layer, thereby trapping hydrogen in the oxide. The damage in the silicon is thereafter annealed by heating at an annealing temperature subsequent to the deposition of the metallic layer, whereby the trapped hydrogen migrates from the oxide to the silicon surface and repairs to the damage.

10 Claims, 3 Drawing Figures

FIG. 1.1
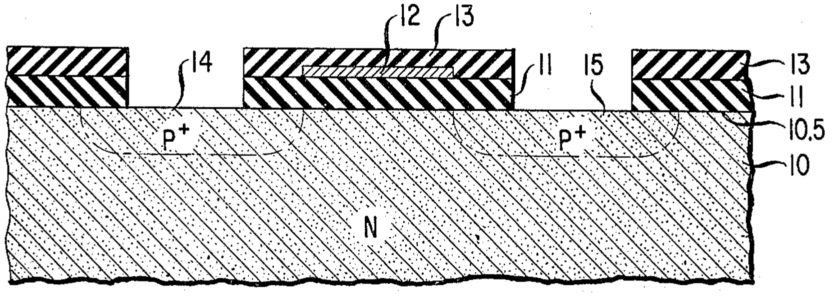
FIG 1.2
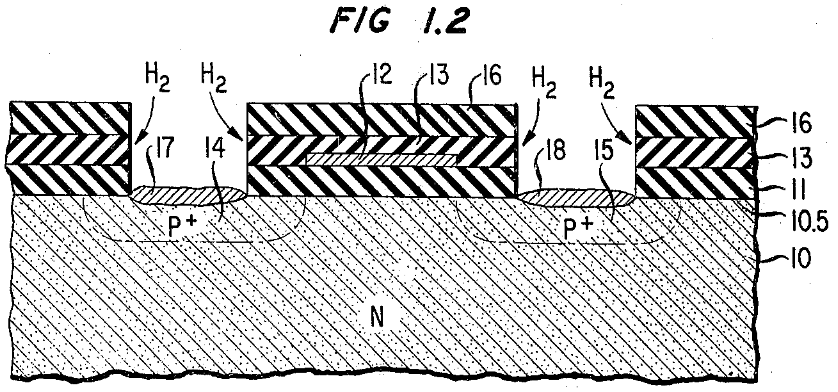
FIG. 1.3
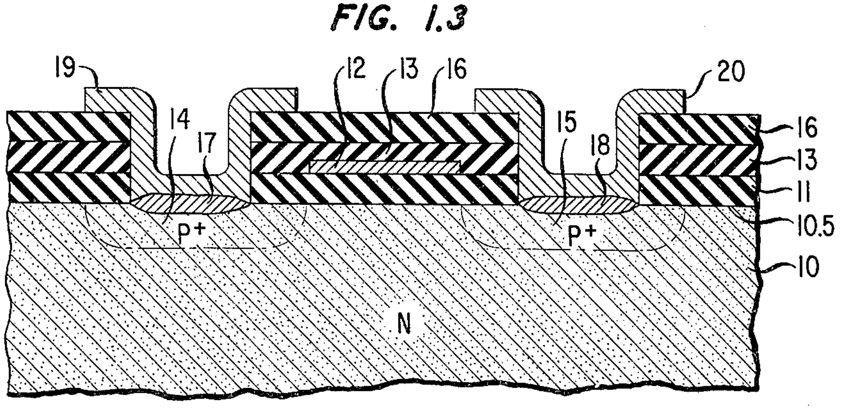

USE OF TRAPPED HYDROGEN FOR ANNEALING METAL-OXIDE-SEMICONDUCTOR DEVICES

FIELD OF THE INVENTION

This invention relates to the field of semiconductor apparatus, and more particularly to fabrication techniques for manufacturing semiconductor devices.

BACKGROUND OF THE INVENTION

In the current technology of large-scale integrated (LSI) circuits, metal-oxide-semiconductor field effect transistor (MOSFET) devices play an important role. A common type of such devices utilizes silicon semiconductor substrates coated with protective insulator layers, such as composite silicon nitride-silicon dioxide layers on the major surface of the silicon substrate in which the MOSFET devices are formed. External electrical contact as well as protection of the source and drain regions of the MOSFET devices is afforded by suitable "second level" metallization, that is, source and drain metallization which is fabricated subsequent to the formation of the gate electrode (first level) metallization.

In forming the second level metallization contacts for these source and drain regions in the semiconductor substrate of the MOSFET devices, a sputtering process rather than an evaporation process would be preferable from the standpoint of good protective coverage of these regions, particularly at the edges of these contacts. The relatively poor coverage resulting from evaporation, as opposed to sputtering, is primarily due to the sharp step at the edge presented by the oxide and other insulator protective layers in conjunction with relatively narrow angles of evaporation; and this poor coverage due to shadows enables unwanted impurity atoms in completed devices to penetrate down to the silicon substrate, particularly atoms of the metal such as gold subsequently used for the interconnections. On the other hand, sputtering of metals onto silicon produces radiation damage which induces undesirable surface states in the silicon, thereby deteriorating stable device performance.

While it is known that hydrogen can be used in heat treatment annealing techniques for neutralizing or repairing the damage in silicon, it has not been considered possible to repair this damage with a hydrogen annealing procedure in the case of LSI-MOSFET devices, since the protective insulator layer, such as the silicon nitride layer, as well as the second level metallization, are both ordinarily impervious to the hydrogen required at the silicon surface during annealing, whereas the damaged silicon surface is sealed against the introduction of hydrogen immediately after the damage-producing sputtering of the second level metallization.

SUMMARY OF THE INVENTION

This invention provides a process of manufacturing a semiconductive silicon device with means for annealing of undesirable silicon semiconductor surface states which have been caused by damage-producing fabrication steps, such as deposition of an electrode by means of sputtering. These damage-producing steps occur either during or after the sealing of the incompleted silicon device by a protective coating which is impervious to the introduction of a desired annealing material for repairing the damage. The electrode material is likewise also impervious to the annealing material. Accordingly, the annealing material, such as hydrogen, is introduced from the ambient into a silicon dioxide layer contiguous to the silicon substrate in the incomplete device, prior to the complete sealing of the device by the impervious protective coating and electrode material. Thereby, the annealing material is then trapped in the silicon dioxide layer by the sealing of the device, so that the trapped annealing material is subsequently available in the sealed device for the purpose of subsequent repair of the damage, as by neutralization of the surface states associated with the damage. This subsequent annealing is thus carried out at a time when the device has been rendered impervious to the introduction of the annealing material, by virtue of the impervious protective coating and the electrode(s).

In a specific embodiment of the invention (FIG. 1.1), a major surface 10.5 of the silicon substrate 10 is first coated with a gate oxide layer 11, a gate electrode layer 12 and an intermediate oxide layer 13. Source and drain apertures are opened through the intermediate oxide layer 13 and the gate oxide layer 11 to expose the surface 10.5 of the substrate 10 in the region of the apertures. Then, implantation or diffusion of impurities for the source region 14 and the drain region 15 is carried out by standard techniques. Then, the intermediate oxide layer and the exposed surfaces of the source and drain regions of the substrate are coated with a protective insulating silicon nitride layer 16, thereby forming a nitride coating over the source and drain regions and a composite nitride oxide coating over the gate electrode 12. The source and drain apertures are then reopened through the silicon nitride layer over these source and drain regions. Next, the exposed source and drain regions are cleaned by such conventional techniques as backsputtering or chemical etching. Platinum is then deposited by sputtering all over the exposed portions of the silicon nitride, silicon dioxide and source and drain regions of the substrate, and the platinum is sintered to form platinum silicide for ohmic electrode contacts 17 and 18 at the surface of the source and drain regions 14 and 15, respectively. The unsintered platinum over the insulating layers is then removed, by chemical etching for example. Thereafter, the substrate is exposed to a hydrogen gas ambient (labeled $H_2$ in FIG. 1.2), whereby hydrogen drifts through the apertures transversely into the oxide layers where the hydrogen is stored. Then, metallic materials for source electrode 19 (FIG. 1.3) and drain electrode 20 are sputtered directly onto the silicon substrate through the apertures; and any unwanted excess sputtered electrode material on the silicon nitride can then be removed by selectively masked backsputtering and chemical etching. The hydrogen, which is still present in the oxide, is then used in conjunction with a heat treatment annealing in order to repair the damage particularly at the silicon surface, previously caused by processing steps including the deposition of electrodes by sputtering and sputter-type etching.

BRIEF DESCRIPTION OF THE DRAWING

This invention, together with its features, advantages and objects, can be better understood from the following detailed description when read in conjunction with the drawing in which:

FIG. 1.1, 1.2 and 1.3 show a silicon MOSFET device in cross section during illustrative successive stages of fabrication in accordance with a specific embodiment of the invention.

For the sake of clarity only, none of the drawings is to scale. It should be understood that, although the drawings show only a single MOSFET device which is being manufactured, many such similar MOSFET devices are typically being simultaneously manufactured in the same semiconductor substrate together with suitable electrode interconnections, as known in the art of integrated circuits.

DETAILED DESCRIPTION

Referring to FIG. 1.1, a silicon dioxide layer 11 coats a major surface 10.5 of a monocrystalline silicon substrate 10. The substrate 10 is typically N-type conductivity semiconductive silicon having a substantially uniform bulk resistivity of the order of 10 ohm-cm, typically in the range of about 5 to 10 ohm-cm. The silicon dioxide layer 11 is typically thermally grown on the surface 10.5 to a thickness of about 1,000 angstroms at a growth temperature in the range of about 1050°C to 1200°C, typically at about 1100°C, for about thirty minutes in a dry oxygen ambient, as known in the art. This thermally grown silicon dioxide layer 11 will serve as the "gate" oxide layer for the MOSFET device being fabricated, that is, the oxide layer separating the gate electrodes from the channel inversion regions of the devices at the major surface 10.5 of the silicon substrate 10. Next, upon the gate oxide layer 11, a gate electrode 12 is fabricated overlying the major surface 10.5 at the gate regions of the MOSFET device. Typically, the gate electrode is polycrystalline silicon ("polysilicon") which is typically deposited by the known technique of pyrolysis of silicon hydride ("silane") at temperatures typically in the range of about 680°C to 800°C, and then selectively masked and etched to the desired gate electrode configuration typically by means of chemical etching as known in the art. Then, upon the exposed surface of the oxide layer 11 and the gate electrodes 12, another silicon dioxide layer 13 is deposited in order to form an "intermediate" oxide layer for the purpose of separating and insulating the first level (gate electrode) from the second level of metallization to be formed. The intermediate oxide layer 13 is typically about one micron thick. This oxide layer 13 is deposited typically by means of a chemical vapor deposition process technique, such as that involving the exposure of the exposed surfaces of the gate electrode 12 and the oxide layer 11 to an ambient of silane and either carbon dioxide or oxygen at a temperature in the range of about 450°C to 950°C, as known in the art.

The next step involves the formation of a source region 14 and a drain region 15 of the MOSFET device being fabricated. To this end, a pair of apertures is opened in the oxide layers 11 and 13, using known masking and etching techniques, thereby exposing the major surface 10.5 at the desired location of the source and drain regions. Then, the source and drain regions 14 and 15 are formed by means of acceptor impurity doping using known implantation or diffusion techniques, the oxide coating typically acting as a mask against doping. Typically, the acceptor impurity is boron which is thereby introduced into the silicon substrate in the regions 14 and 15 by means of diffusion from a boron glass source followed by a thermal drive-in at about 1100° C for about two hours in a nitrogen ambient. Thereby, a net significant impurity concentration typically of about $10^{19}$ or more boron impurities per cubic centimeter is obtained in regions 14 and 15, whereby the electrical conductivity of these regions becomes $P^+$ (strongly P) type conductivity semiconductor. Next, a silicon nitride layer 16 is deposited entirely over the diffused source and drain regions and over the exposed surface of the intermediate silicon dioxide layer 13. The silicon nitride layer together with the silicon dioxide layers 11 and 13 thereby form a composite nitride-oxide coating of the major surface 10.5. Typically, the silicon nitride layer is deposited by chemical vapor deposition from an ambient mixture of ammonia or hydrazine and silane at a relatively high temperature in the range of about 650° C to 900° C, typically about 680° C. This high temperature is well above the temperature at which substantially all of any hydrogen stored in the silicon dioxide layers would be driven out of the oxide by virtue of the heating of the oxide at the commencement of the silicon nitride deposition process. A pair of apertures for the source and drain regions is opened through the silicon nitride layer 16 using either a silicon dioxide mask or suitable photoresist mask as known in the art, in order to expose the source region 14 and the drain region 15 once again. Then, the exposed surface of the substrate 10 (at the apertures) is cleaned, typically by subjecting the substrate to a one-minute backsputtering in order to remove any contamination. Next, platinum silicide electrodes 17 and 18 (FIG. 1.2) are fabricated at the surface of the source and drain regions, thereby forming ohmic contacts for these regions. Typically, these electrodes are formed by first sputtering platinum all over the exposed top surface, and then sintering the platinum into the silicon at about 650°C; and finally removing excess unsintered platinum typically by etching with aqua regia at an elevated temperature of about 90°C or below. In this way, the edges of the silicon dioxide layers 11 and 13 are exposed at the edges of the apertures. Into these edges of the silicon dioxide, hydrogen gas (labeled $H_2$ in FIG. 1.2) is introduced and laterally diffuses into these oxide layers, advantageously by exposure to an ambient flowing stream of pure hydrogen gas at atmospheric pressure or thereabout for a time interval of about one-half hour to one hour more at an substrate annealing temperature of about 350°C to 450°C or more, typically at about 380°C. Thereby, the hydrogen which migrates to the silicon surface between the source and drain regions serves to repair the damage at the surface of the silicon by reducing the member of undesirable surface states in the silicon caused by previous steps such as the deposition of the intermediate oxide layer, the backsputter cleaning, and the sputter deposition of platinum. In addition, excess hydrogen (not used up in reducing the silicon surface states) remains stored in the gate and intermediate oxide layers where it can subsequently serve as a useful source of hydrogen for the purpose of further repairing by means of a subsequent annealing of further silicon interface states to be caused by the processing steps used to complete the fabrication of the MOSFET devices.

In order to complete these MOSFET devices, the second level metallization, including a source electrode 19 and a drain electrode 20 (FIG. 1.3), is fabricated. While the electrodes 19 and 20 are ordinarily triple layers of various metals, for the sake of clarity these electrodes are shown as though composed of only a single metallic layer. For this purpose, successive layers of titanium, followed by an intermediate titanium nitride layer. followed by a top platinum layer, are all deposited by sputtering techniques as known in the art and described for example in U.S. Pat. 3,798,145, issued to P. R. Fournier on Mar. 19, 1974. Then, by selectively plating a mask against backsputtering, for example a nickel mask, on the metallization just deposited, any unwanted platinum metallization is removed by backsputtering at relatively low power density at the cathode of about 1.0 to 1.5 watts per $cm^2$ for about 30 minutes, in order to etch the desired second level metallization pattern into the top platinum layer. Likewise, the correspondingly unwanted titanium nitride and titanium metallization is then removed by known chemical etching, ordinarily using EDTA (ethylene diamine tetra-acetic acid). The remaining pattern of the (top) platinum, titanium nitride and titanium layers provides the desired completed second level metallization pattern, including a source electrode 19 and a drain electrode 20 (FIG. 1.3), to which gold metal contacts can be attached at the top (exposed) platinum layer. As known in the art, palladium can be substituted for platinum in the top (exposed) metal layer of the second level metallization; and palladium silicide can also be used as the ohmic contact material in the electrodes 17 and 18.

Finally, any damage at the silicon substrate surface 10.5 caused by the electrode sputtering is the repaired by a final heat treatment in a neutral ambient of vacuum or nitrogen gas for example, at an annealing temperature in the range of about 250°C to 450°C, typically about 325°C for one hour. Thereby, the hydrogen previously introduced into the oxide layers redistributes by migration to the silicon surface 10.5, including the region of the silicon surface directly underneath the gate electrode 12, thereby neutralizing the undesirable interface states produced as a result of damage during device fabrication. Annealing temperatures below about 370°C are preferred during the final heat treatment if gold metal contacts (to the second level metallization) are present.

It is important that the hydrogen gas stream used for introducing the hydrogen with the silicon dioxide be purified and thereby be free of such impurities as oxygen, moisture and sodium.

While this invention has been described in terms of specific embodiments, various modifications can be made without departing from the scope of this invention. For example, the hydrogen may be introduced into the apertures just prior to, instead of subsequent to, the formation of the silicide electrodes 17 and 18. However, the hydrogen should not be introduced prior to the deposition of the insulation layers including the silicon nitride at the relatively high deposition temperatures ordinarily used, that is, above about 450°C, because such high temperatures would drive out any hydrogen which advantageously should be stored in the oxide layers.

It should also be understood that this invention can also be practiced with a relatively low-temperature plasma-type chemical vapor deposition at about 250°C or below as described in the U.S. Pat. 3,757,733, issued to A. R. Reinberg on Sept. 11, 1973. In using such a relatively low-temperature plasma deposition of silicon nitride, the hydrogen can be introduced over the exposed surface of the intermediate silicon dioxide layer 13 prior to the deposition of the silicon nitride but subsequent to the formation (at relatively high temperature) of the source and drain regions, since the relatively low temperature used for the plasma-type deposition of silicon nitride is not sufficient to drive out the hydrogen which is thereby stored in the silicon dioxide layers 13 and 11.

This invention can also be practiced when using evaporated aluminum as the second metallization, that is, where the aluminum serves as both ohmic contact and interconnection electrodes which are then sealed by a low-temperature plasma deposition of silicon nitride. External beam leads of gold can be attached to the aluminum metallization through apertures in the silicon nitride using an intermediate layer of platinum, titanium nitride and titanium in these apertures for connecting the gold beam lead with the aluminum, thereby protecting the aluminum and hence the silicon from undesired migration of gold. In such a case, damage is again produced by the sputtering of the intermediate layer of platinum, titanium nitride, and titanium, as well as of the gold. This damage can be repaired by first introducing hydrogen, prior to the deposition of the silicon nitride and preferably subsequent to the evaporation-deposition of the aluminum, all over the then exposed portion of the intermediate silicon dioxide layer. The evaporation of aluminum at low pressures tends to cause out-gassing of any stored hydrogen, and that is why it is preferable to introduce the hydrogen subsequent to the aluminum evaporation.

However, in any event the hydrogen should not be introduced prior to the deposition of the silicon dioxide layer 13 because of the relatively high temperatures and oxidizing ambients used for the deposition of this intermediate oxide. High temperatures tend to drive the stored hydrogen out of the oxide, whereas oxygen ambients tend to combine with the hydrogen to form water. When using the relatively low-temperature deposition of silicon nitride, moreover, it should be understood that, if the hydrogen has been introduced into the oxide prior to the deposition of the nitride, then the temperature used for the nitride will be sufficient for annealing the previous damage at the interface caused by the relatively high-temperature deposition of the intermediate silicon dioxide layer 13, while the remaining excess hydrogen stored in the oxide will still be available for subsequent annealing of damage caused by the sputtering of the electrodes.

It should be further understood that the diffusion or implantation of the $P^+$ source and drain regions 14 and 15 may be omitted when using a double Schottky barrier field-effect device as known in the art. Finally, while the substrate has been described as N-type silicon with the source and drain regions $P^+$ type, the roles of N and P may be interchanged whereby the substrate is P type and the source and drain regions are $N^+$ type semiconductors. In addition, other annealing materials besides hydrogen in conjunction with silicon dioxide or other insulating layers and silicon or other semiconductor substrates may be found suitable in the fabrication of semiconductor devices in accordance with the principles of this invention.

What is claimed is:

1. In a process of manufacturing a semiconductor device, the device including a semiconductive silicon substrate a major surface of which is coated by a composite electrically insulating layer, the composite insulating layer including a layer of silicon dioxide formed upon the major surface of the substrate and a protective layer formed on the layer of silicon dioxide, the protective layer having apertures which contain electrodes deposited in the apertures, the layer of silicon dioxide being sealed by the combination of the protective layer and the electrodes against the introduction into the layer of silicon dioxide of a gas which is useful in a heat treatment for repairing damage in the silicon substrate including damage caused by the deposition of the electrodes, the step of:

introducing the gas into the layer of silicon dioxide prior to the deposition of the electrodes.

2. The process of claim 1 in which the gas is hydrogen, and in which the gas is introduced into the layer of silicon dioxide through the apertures in the composite layer subsequent to the formation of the protective layer.

3. The process of claim 2 in which the protective layer contains a layer of silicon nitride which is formed at a substrate temperature above which hydrogen in the layer of silicon dioxide is driven out of the said silicon dioxide.

4. The process of claim 1 which further includes the step of carrying out said heat treatment by maintaining the substrate for a predetermined time subsequent to the deposition of the electrodes at a predetermined temperature sufficient for said gas to repair damage in the substrate caused by the deposition of the electrodes.

5. The process of claim 4 in which the gas is hydrogen.

6. In a process of manufacturing a semiconductor device, the device including a semiconductive silicon substrate a major surface of which is coated with a composite insulating layer, the composite insulating layer including a layer of silicon dioxide formed on the major surface of the substrate and a protective layer formed on the layer of silicon dioxide, the protective layer having apertures which contain electrodes deposited in the apertures, the layer of silicon dioxide containing molecules of a gas which is trapped in the layer of silicon dioxide, the combination of the protective layer and the electrodes being impervious to the gas thereby sealing the layer of silicon dioxide against the introduction of the gas into said layer of silicon dioxide, the major surface characterized by damage caused by the deposition of the electrodes, the step of;

heating the substrate for a predetermined time interval subsequent to the deposition of the electrodes at a temperature sufficient for the trapped gas to repair the damage.

7. The process of claim 6 in which the gas is hydrogen.

8. The process of claim 7 in which the protective layer contains a layer of silicon nitride.

9. The process of claim 8 in which the layer of silicon nitride is formed at a substrate temperature above which hydrogen in the layer of silicon dioxide is driven out of the layer of silicon dioxide.

10. In a process of manufacturing a semiconductor device, the device including a semiconductive silicon substrate a major surface of which is coated by a composite electrically insulating layer, the composite insulating layer including a layer of silicon dioxide formed upon the major surface of the substrate and a projective layer formed on the layer of silicon dioxide, the protective layer having apertures, the layer of silicon dioxide being sealed by the combination of the protective layer and the electrodes against the introduction into the layer of silicon dioxide of hydrogen gas, the steps of:

a. introducing hydrogen gas into the layer of silicon dioxide prior to the fabrication of the electrodes; and b. heat treating the silicon substrate at a predetermined temperature for a predetermined time subsequent to the deposition of the electrodes, whereby hydrogen in the layer of silicon dioxide can migrate to the major surface of the substrate, in order to repair damage in the substrate including damage caused by the deposition of the electrodes.

* * * * *